United States Patent
Cameron et al.

(10) Patent No.: US 6,172,548 B1
(45) Date of Patent: Jan. 9, 2001

(54) INPUT STAGE WITH REDUCED TRANSIENT TIME FOR USE IN MULTIPLEXING TRANSDUCERS THAT REQUIRE A SWITCHED DC BIAS

(75) Inventors: Scott Warren Cameron, Milpitas; Axel Alegre de La Soujeole, Scotts Valley, both of CA (US)

(73) Assignee: STMicroelectronics, Inc., Carrollton, TX (US)

(*) Notice: Under 35 U.S.C. 154(b), the term of this patent shall be extended for 0 days.

(21) Appl. No.: 08/366,561

(22) Filed: Dec. 30, 1994

(51) Int. Cl.$^7$ .................................................. H03L 5/00
(52) U.S. Cl. ............................ 327/309; 327/561; 360/67
(58) Field of Search ........................ 327/309, 560–563; 330/51, 69; 360/67, 68

(56) References Cited

U.S. PATENT DOCUMENTS

| | | | |
|---|---|---|---|
| 4,633,344 | 12/1986 | Jeffers | 360/77 |
| 5,229,719 | * 7/1993 | Tagiri | 330/51 |
| 5,327,297 | 7/1994 | Enami et al. | 360/46 |
| 5,361,037 | 11/1994 | Qui | 330/9 |
| 5,424,678 | * 6/1995 | Heyl et al. | 330/51 |

FOREIGN PATENT DOCUMENTS

| | | |
|---|---|---|
| 0348027 | 12/1989 | (EP) . |
| 0415080 | 3/1991 | (EP) . |
| 9300590 | 1/1993 | (WO) . |

OTHER PUBLICATIONS

1987 IEEE International Solid–State Circuits Conference, Digest of Technical Papers, ISSCC, First Edition, New York, NY, Feb. 25–27, 1987, Fb. 1987, Coral Gables, FI, Lewis Winner, pp. 44–45, 333–334, XP002006676 Armstrong M et al.: "A CMOS programmable Self–Calibrating 13 b eight–channel analog interface processor".

* cited by examiner

Primary Examiner—Jeffrey Zweizig
(74) Attorney, Agent, or Firm—Theodore E. Galanthay; Lisa K. Jorgenson; Gordon H. Telfer (57) ABSTRACT

The present application discloses an innovative improved circuit, in which the long transient at write-to-read transitions is avoided by using a shorting switch to short the inputs of the first amplifier stage together when the read amplifier is activated. This speeds up write-to-read transition. Moreover, since read mode can now be entered more quickly after a power-down condition, this circuit also permits the use of other power-saving tricks to idle the read amplifier momentarily.

25 Claims, 6 Drawing Sheets

INPUT STAGE WITH REDUCED TRANSIENT TIME FOR USE IN MULTIPLEXING TRANSDUCERS THAT REQUIRE A SWITCHED DC BIAS

BACKGROUND OF THE INVENTION

1. Field of the Invention

The present application relates to read amplifiers for magnetoresistive magnetic storage systems, particularly for disk drives.

2. Description of the Prior Art

Magnetoresistive Heads

Magnetoresistance is a solid-state phenomenon wherein the resistance of an element is affected by the magnetic field around it. This physical phenomenon has been discussed for some years as a way to read the data which is stored in magnetization patterns in tape and disk drives. Disk drive manufacturers have now developed the fabrication technology to manufacture magnetoresistive drives on a large scale.

In a disk drive, traditionally the head was a coil (or more recently a thin film head which is equivalent to a coil), imbedded in some form of a support that slid across the top of the disk platter, and positioned to create a magnetic field in a small area of the surface of the platter. By controlling the amount of current that flows to the coil, and switching it from one direction to the other direction, a series of magnetic dipoles would be created in the ferromagnetic medium at the surface of the disk. That exact same coil would also be used in the read-back mode, to detect changes in the magnetic field vector of the magnetic medium.

Normally a "1" is indicated, on the disk, by a transition in the magnetic field. No transition would imply a zero. (These transitions are synchronized in ways not relevant here.) In the read-back mode, the coil becomes a BEMF generator, and a change in magnetic flux (due to crossing a domain boundary in the medium) will induce a voltage on the coils, which is sensed and amplified to detect the changes in the magnetic structure of the medium. This sensed voltage therefore provides a readout of the information stored in the magnetic medium, without disturbing it.

A disk drive normally includes multiple head elements each mounted on respective arms. The arms move across the disk and trace out various rings of magnetic data. If we could see the magnetic domain boundaries in the magnetic medium on the disk, we would see chains of overlapping circles, almost like overlapping punch-outs, where the write head changed its magnetic field and pushed out a new flux domain. The written domains are spaced closely enough to overlap (and therefore very few of them are circular), but there is enough remaining area in each one to preserve the written data.

If we are reading back with the same coil, then we have to make sure we have a space between the tracks of data, so that the magnetic flux of the adjacent track cannot interfere with coil readings. This intertrack separation requirement limits the density, so that in effect the density has an ultimate limit defined by the dimensions of our thin film head.

However, if we could somehow read a narrower stripe than the written strip, we could avoid intersymbol interference between adjacent tracks. Thus the limiting factor in traditional systems is not the writing, but the fact that traditional systems have to read back with the same inductive element. If we could read back using a sensor with smaller width (i.e. that magnetically coupled to a narrower area of the disk's magnetic medium), then we could reduce the track-to-track spacing. Even while using the same inductive element for writing, and writing with the same data frequency, we can write adjacent tracks more closely together, so that the circular magnetic domains of adjacent tracks actually overlap.

The magnetoresistive ("MR") head has a very narrow strip to it. (In fact, MR heads are actually fabricated with integrated circuit fabrication technology.) Thus, MR heads provide a way to read magnetic data which is very closely spaced (with very close track-to-track spacings) without intersymbol interference. By contrast, if we were to try to read this pattern back with a thin film head, we would get a tremendous amount of intersymbol interference, and we would not get a reliable read-back. (An example of a modern MR head design is shown in Saito et al., "Development of a magnetoresistive/inductive head and low noise amplifier IC for high density rigid disk drives," E76-A IEICE TRANSACTIONS ON FUNDAMENTALS OF ELECTRONICS, COMMUNICATIONS AND COMPUTER SCIENCES 1167-9 (1993), which is hereby incorporated by reference.)

The MR sensing element, basically, is a strip in the head which has a variable resistance which is affected by the ambient magnetic field. To sense this variable resistance, it is biased with a constant current: changes in the resistance will then appear as a voltage change. Since the MR sensing element is a physically narrow strip, it can ride right down the middle of the track, and avoid most of the intersymbol interference from the overlap at the edges of the tracks. Also, the readout from an MR head is not a function of the transitions (as with a sensing coil), but simply a function of the magnitude of the magnetic field.

BIASING AND INTERFACING TO THE MR HEAD

Thus magnetoresistive ("MR") head technology promises to produce a new generation of disk drive density. However, the interface requirements to an MR head are significantly different from those of conventional read heads. The bias current through the magnetoresistive element must be set so as to optimize the operating point of the read elements.

State-of-the-art tape drives also employ MR heads, to achieve the advantage of speed-independent signal amplitude as well as increased bit density.) In such systems, since the preamplifier may have to support simultaneous reading from a number of MR elements, power consumption may also be an important consideration.

Background on MR head and preamplifier technology may be found, e.g., in Rohen, "Wave-shaping circuit for a magnetoresistive read head," 21 IBM TECHNICAL DISCLOSURE BULLETIN 984–5 (August 1978); Jones, "Magnetoresistive amplifier," 20 IBM TECHNICAL DISCLOSURE BULLETIN 4114–15 (March 1978); van Gestel et al., "Read-out of a magnetic tape by the magnetoresistance effect," 37 PHILIPS TECH. REV. 42–50 (1977, no. 2–3); Robinson et al., "A 0.8 nV/ square root Hz CMOS preamplifier for magneto-resistive read elements, "1994 ISSCC 252–3; all of which are hereby incorporated by reference.

Figure 1:
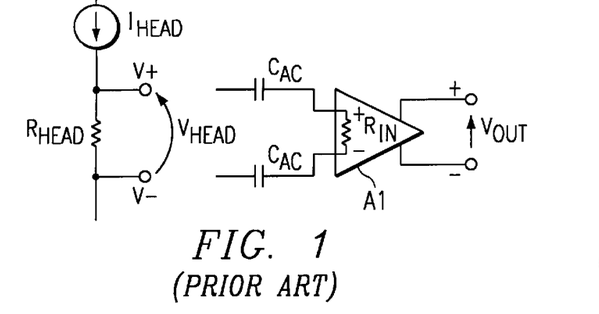
FIG. 1 shows the conventional signal output connections for a read-head preamplifier.

FIG. 1 shows the conventional signal input connections for a read-head preamplifier. A certain bias current Ihead is applied to the read-head (herein indicated as resistor Rhead), and the magnetoresistive variation in the head induces an AC voltage $V_{head}$ across terminals V+ and V−. The AC component $V_{head}$ is much smaller than the DC drop $I_{head}$·

$R_{head}$. The AC component of this signal is therefore coupled through two coupling capacitors $C_{AC}$ to the inputs of a first preamplifier stage A1.

Figure 2:
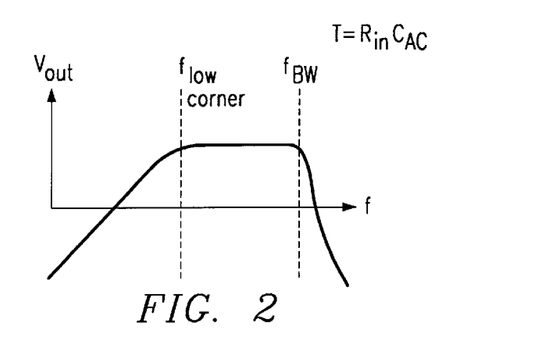
FIG. 2 shows the frequency response of a system like that shown in FIG. 1.

FIG. 2 shows the frequency response of a system like that shown in FIG. 1. Note that the upper corner frequency $f_{BW}$ is set by the time constant $R_{in}C_{AC}$, where $R_{in}$ is the input impedance of the preamplifier stage A1. The attempts to integrate the coupling capacitors $C_{AC}$ necessarily result in a small capacitance value (e.g. 100 pF or so), so that it is desirable to have a large input impedance $R_{in}$ to maintain good high-frequency response. However, this produces a problem, as will now be described.

For power conservation reasons, it is desirable, in many system implementations, to discontinue the bias current to the read head when write operations are occurring. When the bias current to the read head is restored, much of the resulting change in voltage will be coupled through the coupling capacitors, so that the amplifier inputs will initially be forced to a voltage difference which represents the DC bias across the sensing resistor, which is much larger than the typical magnitude of the AC components. The input amplifier will therefore be overloaded, and clamped in an overload condition until the input impedance $R_{in}$ has discharged the DC component of the coupling capacitors. This may be a relatively long time. With the sample values of Rin and $C_{AC}$ given above, the RC time constant is only about 1 μsec; but since Vbias is MUCH larger than the AC signal level, it may take a number of time constants for the applied Vbias to decay to within the linear range of the amplifier.

If these coupling capacitors are external components, they can be as high as 0.1 microfarad; but it is greatly preferable to integrate these into the chips, and that makes it desirable to keep their value low (preferably around 100 pF). They would go into the input stage of an amplifier which represent read path amplification. The details of that amplifier are not really important. What is important is that it has a relatively high input impedance $R_{IN}$. There is a low corner frequency. If we looked at the output, $V_{OUT}$ over frequency, you would see this rise up and then flatten out and then come back down again. The lower corner frequency $f_{low}$ corner represents the lowest frequency that we can AC couple into that circuit. The upper corner frequency $f_{BW}$ (where BW represents bandwidth) represents the ultimate speed of the amplifier, i.e., the highest frequency that we could operate it with, and is limited by the time constant to $$f = \frac{1}{R_{in}C_{AC}}$$

To obtain good high-frequency performance we must keep this time constant low, which means that if we want to shrink the coupling capacitors we must make $R_{in}$ relatively high. The problem with that is what happens now when you are in the write mode and you power down the stage, and the head voltage goes away to zero volts.

If left in that situation for a long period of time, the coupling capacitors will fully discharge. They have no voltage on them. Now when we want to go back into the read mode, we want to get into read mode quickly. We pump current through the heads and we drive the DC voltage up quickly, but the voltage across the capacitor cannot change instantaneously. Thus most of the restored bias voltage on the read element appears at the amplifier inputs, and the amplifier (which has fairly high gain) is driven far into saturation. The amplifier will stay in saturation until the AC coupling capacitors get charged up by the input differential of the op amp, and that is a very slow process.

The result of this is that a big glitch, or transient effect, often appears when we switch from write mode into read mode. This glitch holds the amplifier outputs locked for a long time while the inputs to the amplifier decay back into the range of the AC operating voltage. However, the capacitors will charge up only slowly, because there is a high $R_{in}$.

SUMMARY OF THE INVENTION

The present application discloses an innovative improved circuit, in which the long transient at write-to-read transitions is avoided by using a shorting switch to short the inputs of the first amplifier stage together when the read amplifier is activated. This speeds up write-to-read transition. Moreover, since read mode can now be entered more quickly after a power-down condition, this circuit also permits the use of other power-saving tricks to idle the read amplifier momentarily. Since this additional switch is shunt-connected rather than series-connected, it does not add any noise contribution.

The shorting switch is activated by a pulse which is synchronized to the transitions in the write/read command. The write/read command (W/R) is not only connected to the write and read heads, but also to a circuit which generates a pulse off the edge. In the presently preferred embodiment this is just a one shot, and the duration of the pulse is not very critical. (The pulse duration can be far smaller than the decay time which would otherwise be required.) In the presently preferred embodiment the pulse duration is 0.5 microseconds, but of course this could be varied. When we go into the read mode from the write mode, not only do we power up the head (which happens in less than a microsecond), we also short together the inputs to the amplifier for a short period. Thereafter the amplifier appears as a high impedance, and read operation can proceed.

According to a disclosed class of innovative embodiments, there is provided: An integrated circuit for interfacing to a disk drive having at least one magnetoresistive sensing element, comprising: a current generator connected to drive a bias current across said magnetoresistive sensing element; connections for transferring the AC voltage on said magnetoresistive sensing element through one or more coupling capacitors, to provide a differential AC voltage signal; a preamplifier connected to receive and amplify said differential AC voltage signal; a shorting switch connected to selectably short out said differential voltage signal at the inputs to said preamplifier; and logic connected to activate said shorting switch for a limited time when said current generator turns on; whereby said shorting switch discharges the DC potential which appears on said differential AC voltage signal when said current generator is first turned on. The current generator in another disclosed class of innovative embodiments is a switchable current generator and the logic is connected to activate the shorting switch for a limited time when the current generator is switched on.

According to another disclosed class of innovative embodiments, there is provided: An integrated circuit read amplifier, connectable to a magnetoresistive sensing element, comprising: first and second connections for receiving the voltage from a magnetoresistive element which is biased, during read conditions, but not during at least some write conditions, by a bias current; a preamplifier stage having first and second differential input connections operatively connected to said respective two connections of said magnetoresistive sensing element; at least one capacitor electrically interposed between one of said inputs of said amplifier.and a respective terminal of said magnetoresistive sensing element; and a shorting switch which is connected across said input connections of said preamplifier stage, and is connected to short out said input connections when full bias current is restored to said magnetoresistive sensing element after having been reduced thereon; whereby saturation of said input stage due to charge pumping through said capacitors when bias current is restored is avoided.

According to another disclosed class of innovative embodiments, there is provided: A method for sensing voltages from a magnetoresistive sensing element, comprising the steps of:

(a) providing a bias current to said magnetoresistive sensing element during read modes, but not during at least some write modes;

(b) coupling the AC component of voltage on said magnetoresistive sensing element out, through one or more coupling capacitors, to differential input connections of a differential preamplifier stage; and (c) shorting together said inputs of said preamplifier stage, for a limited time, each time a current generator for the bias current switches on.

According to another disclosed class of innovative embodiments, there is provided: An integrated circuit for interfacing to a disk drive, comprising: first external connections for one or more write heads; second external connections for one or more magnetoresistive read heads; read interface circuitry for providing a bias current to said second external connections, and for amplifying AC voltages received on said second external connections; write amplifier circuitry for driving said write heads in accordance with signals received on said first external connections; wherein said read interface circuitry comprises a current generator connected to drive a bias current across said magnetoresistive sensing element; connections for transferring the AC voltage on said magnetoresistive sensing element through one or more coupling capacitors, to provide a differential AC voltage signal; a preamplifier connected to receive and amplify said differential AC voltage signal; a shorting switch connected to selectably short out said differential voltage signal at the inputs to said preamplifier; and logic connected to activate said shorting switch for a limited time when said current generator turns on; whereby said shorting switch discharges the DC potential which appears on said differential AC voltage signal when said current generator is first turned on.

BRIEF DESCRIPTION OF THE DRAWING

The disclosed inventions will be described with reference to the accompanying drawings, which show important sample embodiments of the invention and which are incorporated in the specification hereof by reference, wherein.

DETAILED DESCRIPTION OF THE PREFERRED EMBODIMENTS

Figure 3:
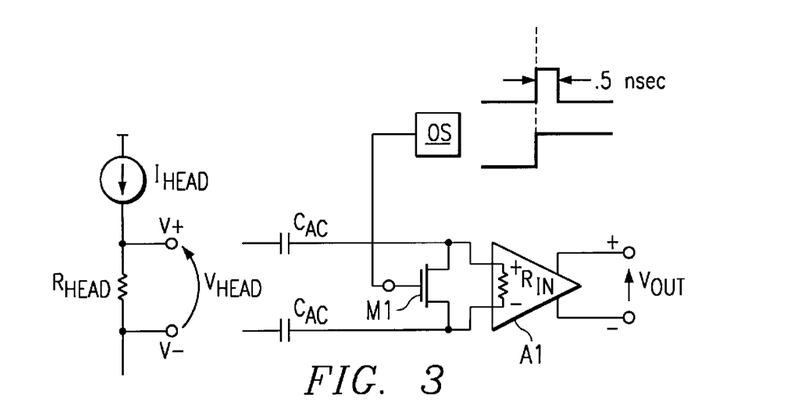
FIG. 3 shows an innovative modified read head preamplifier, which avoids the problems of the circuit of FIG. 1.

The numerous innovative teachings of the present application will be described with particular reference to the presently preferred embodiment (by way of example, and not of limitation), in which:

FIG. 3 shows an innovative modified system, which avoids the long transient by using the present invention. As is conventional, a certain bias current Ihead is applied to the read-head (herein indicated as resistor $R_{head}$), and the magnetoresistive variation in the head induces an AC voltage $V_{head}$ across terminals V+ and V−. The AC component $V_{head}$ is much smaller than the DC drop $I_{head}R_{head}$. The AC component of this signal is therefore coupled through two coupling capacitors $C_{AC}$ to the inputs of a first preamplifier stage A1.

In the configuration of FIG. 3, a switching transistor M1 is added to short out the input impedance $R_{in}$ of the amplifier. A one shot is used to drive this transistor, and the one shot is fired whenever the W/R line makes a transition indicating a switch from the write mode to the read mode. In a sample embodiment, the magnitude of each coupling capacitor $C_{AC}$ may be e.g. 100 pF. The magnitude of the input impedance of the amplifier may be e.g. 10 KΩ at the frequencies of interest.

Figure 4:
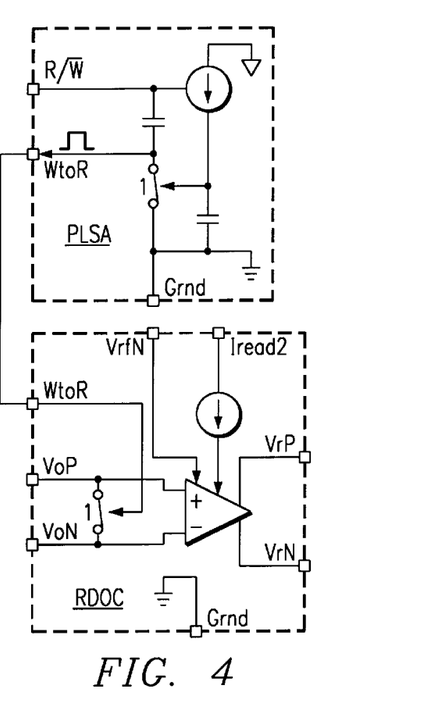
FIG. 4 shows more details of the first stage of the preamplifier and one-shot of FIG. 3, in the presently preferred embodiment.

FIG. 4 shows more details of the first stage of the preamplifier and one-shot of FIG. 3, in the presently preferred embodiment. In FIG. 4, an amplifier stage RDOC comprises an amplifier with plus (+) and minus (−) input terminals for receiving the voltage from a sensing element (not shown in this Figure). The switch 1 illustrated in FIG. 4 corresponds to switching transistor M1 of FIG. 3. A Write-to-Read (WtoR) terminal of the amplifier stage RDOC is shown connected to a like labeled terminal of a one-shot, PLSA. On receipt of a signal at terminal R/W̄ indicating read, and not write, conditions, a pulse is generated at WtoR that affects the switch of RDOC.

Figure 5:
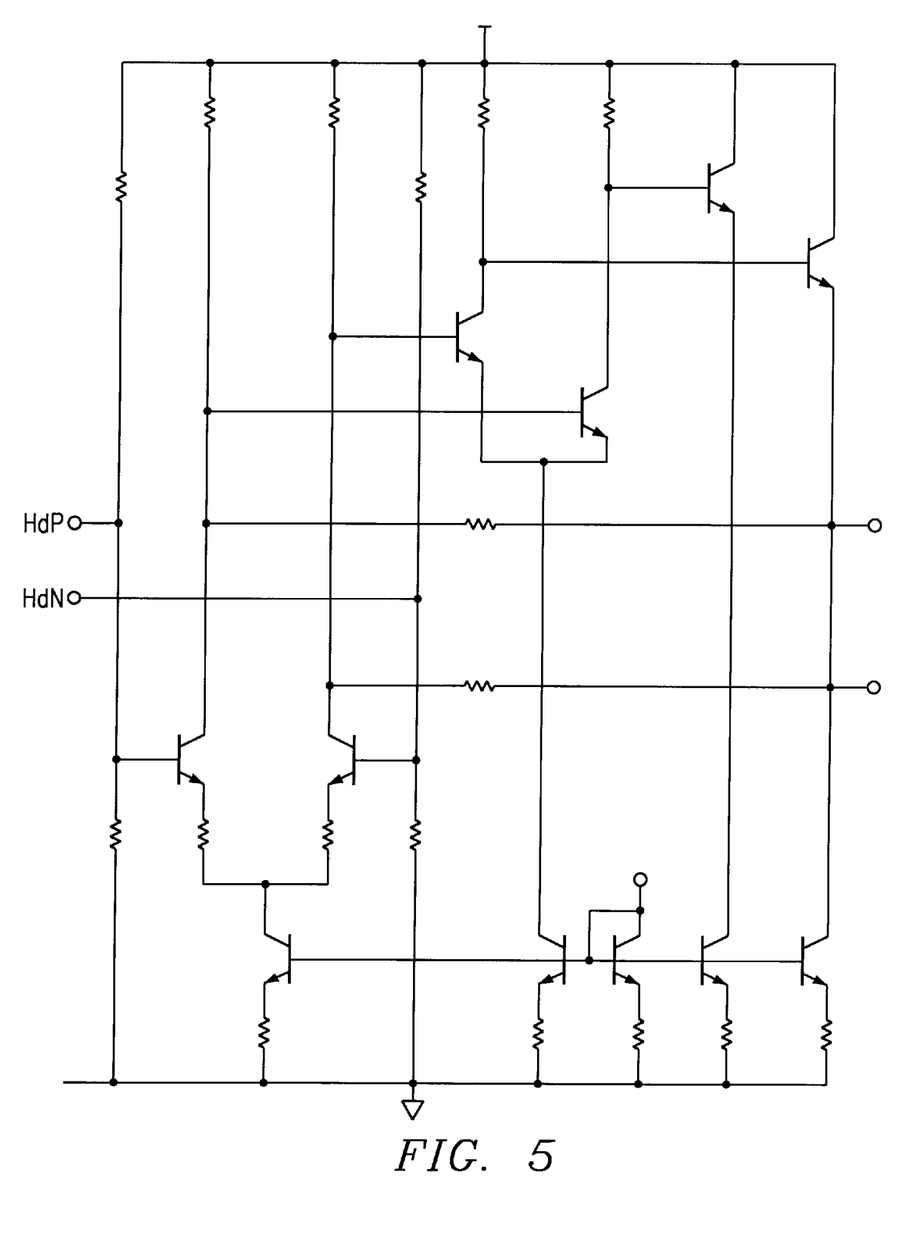
FIG. 5 shows a sample specific differential amplifier circuit which can be used in the configuration of FIG. 4.

FIG. 5 shows a sample specific differential amplifier circuit which can be used in the configuration of FIG. 4. As will be obvious to those skilled in the art, the input impedance can be varied by appropriate selection of the size of the input differential pair, the value of their emitter resistors, and the bias current. The circuit of FIG. 5 shows the terminals, HdP and HdN, that are respective positive (+) and negative (−) terminals corresponding to those shown in FIG. 3. The arrangement of transistors and resistors of FIG. 5 illustrates an embodiment of the amplifier of FIG. 3.

Figure 6A:
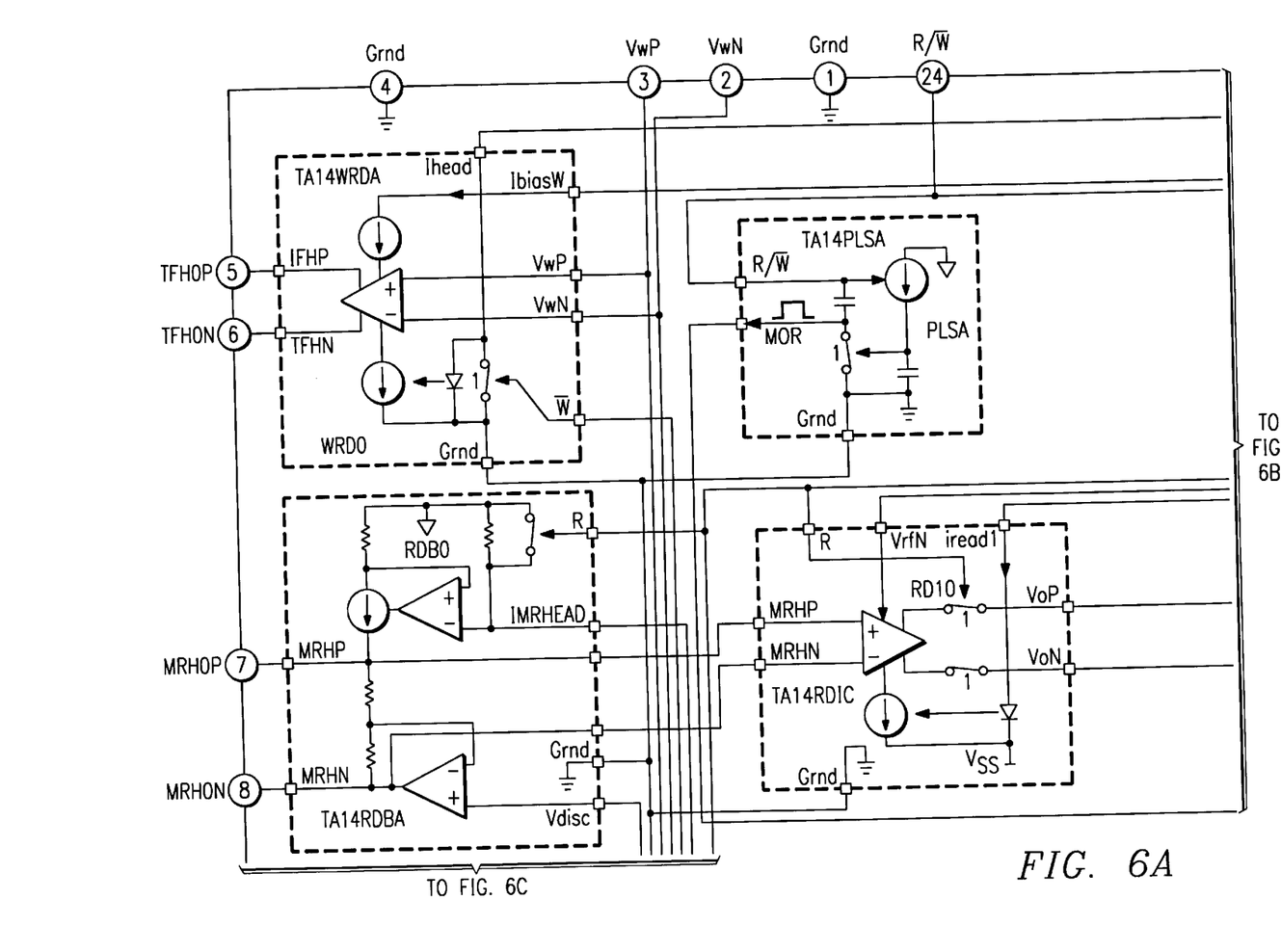
FIGS. 6A, 6B, 6C, and 6D are four parts of a single drawing which shows a sample drive head interface chip which advantageously incorporates an innovative read head preamplifier like that of FIG. 3.
Figure 6B:
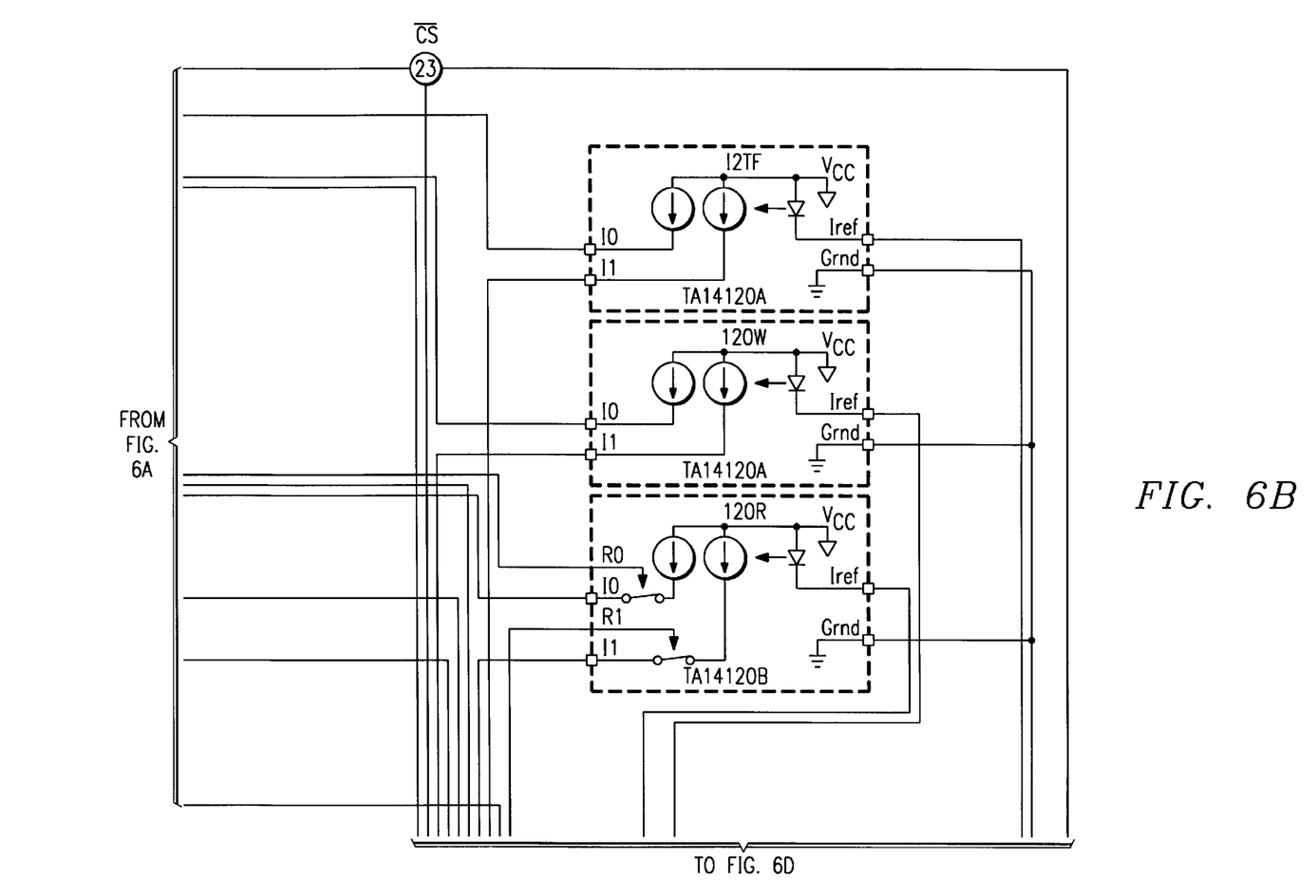
Figure 6C:
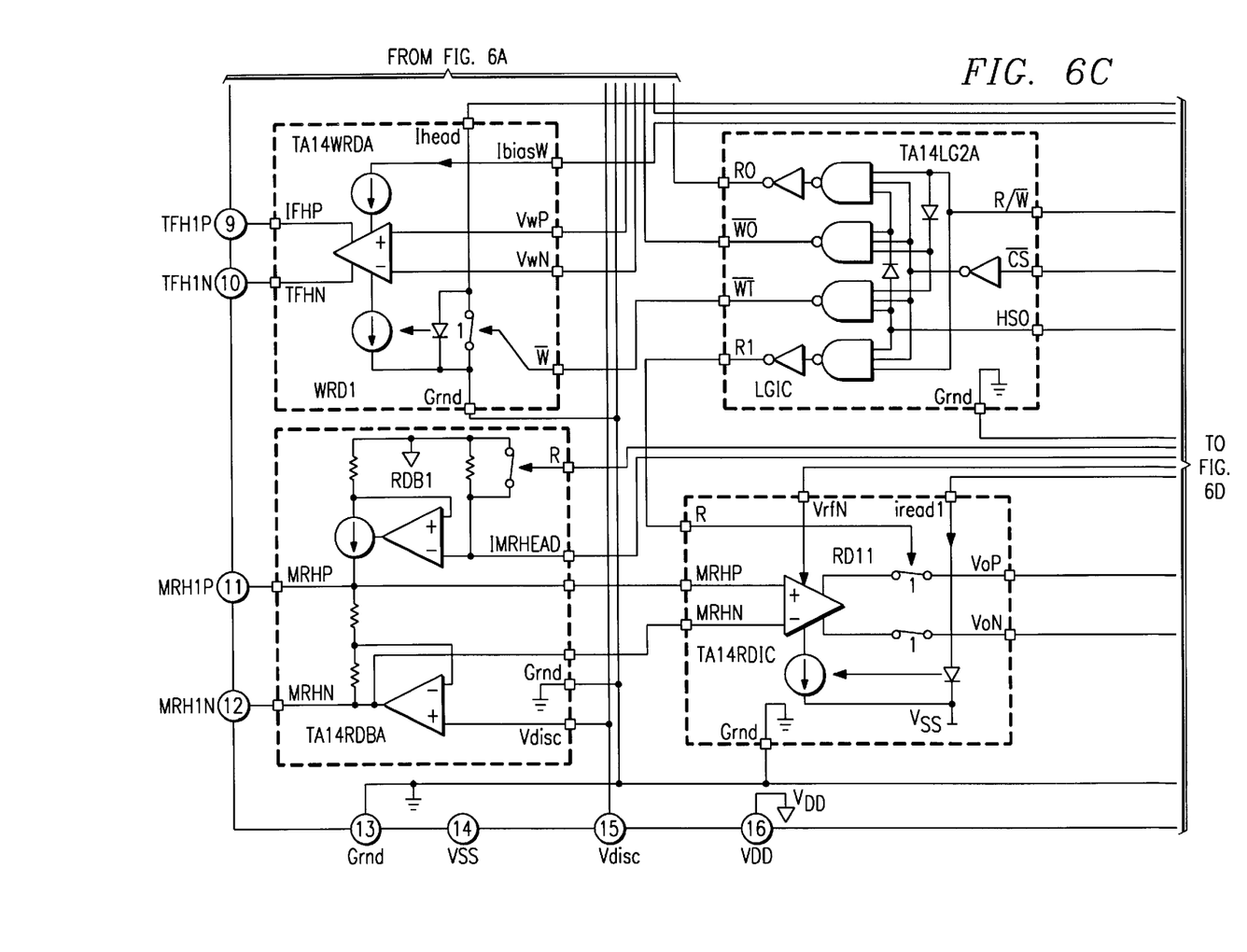
Figure 6D:
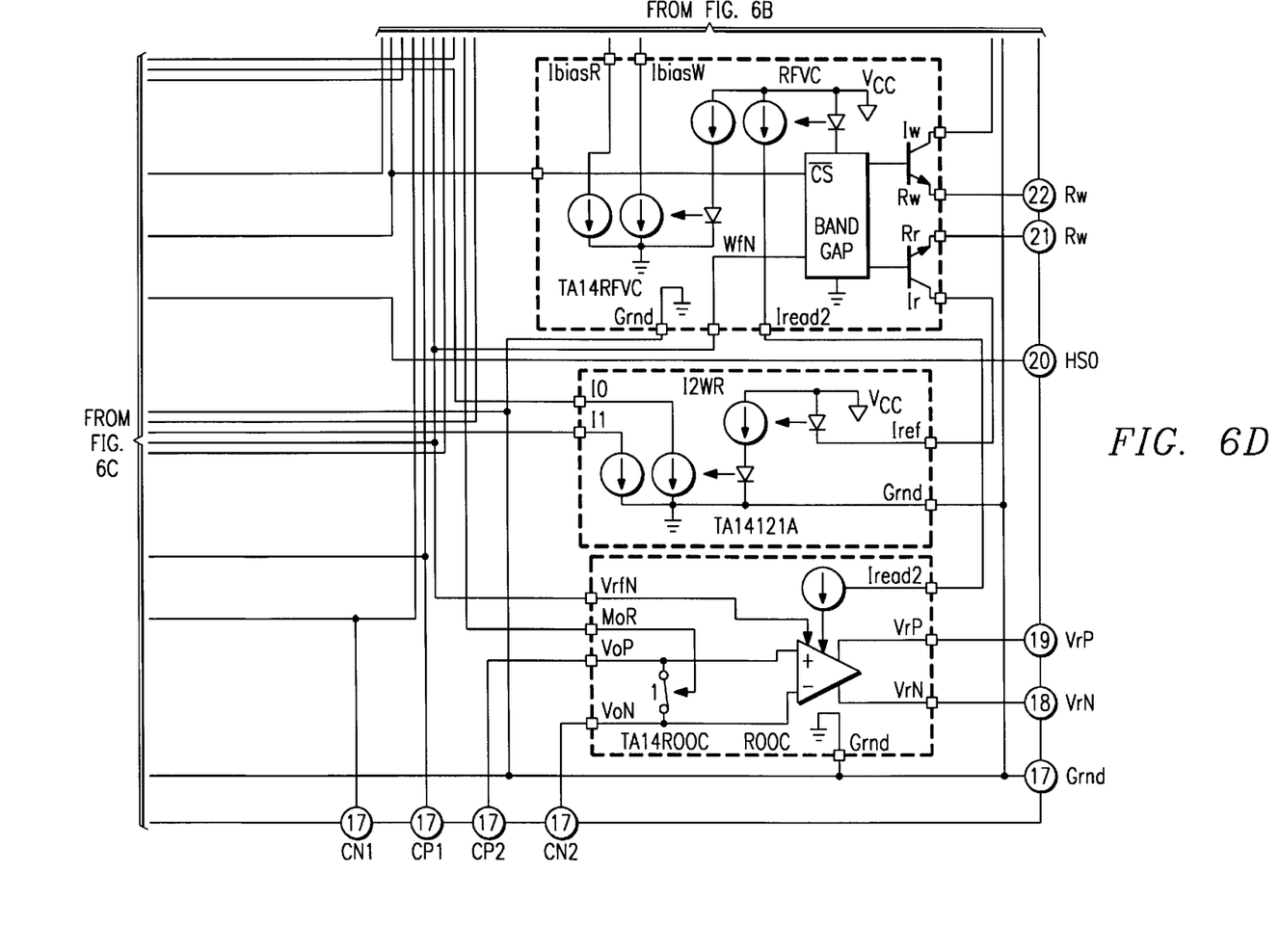

FIGS. 6A, 6B, 6C and 6D are four parts of a single drawing which shows a sample drive head interface chip into which an innovative read head preamplifier like that of FIG. 3 or 4 can advantageously be substituted. Note that the amplifier stage ROOC shown in FIG. 6D is fed, in this embodiment, by the output of a selected head input buffer RD10, FIG. 6A, (connected to pins MRHON/P for a first magnetoresistive read head) or head input buffer RD11, FIG. 6C, (connected to pins MRH1N/P for a second magnetoresistive read head). This chip also incorporates two write amplifiers WRD0 (FIG. 6A) and WRD1 (FIG. 6C), which are connected, respectively, to pinouts (TFH0N/P and TFH1N/P) for two thin-film write heads. Biasing for the magnetoresistive read heads is provided by circuit blocks RDB0 (FIG. 6A) and RDB1 (FIG. 6C). The operation of these blocks is described in greater detail in the following applications, all of which have effective filing dates identical to that of the present application, and all of which are hereby incorporated by reference:

Ser. No. 08/366,793, filed Dec. 30, 1994, entitled "Differential High Speed Inductive Driver with a Bidirectional Current Limiting Output Stage", now U.S. Pat. No. 5,546,030, issued Aug. 13, 1996.

Ser. No. 08/366,792, filed Dec. 30, 1994, entitled "Symmetrical Resistive Transducer Biasing Circuit and Methods", now, (after continuation application Ser. No. 707,655, filed Sept. 12, 1996) U.S. Pat. No. 5,701,213, issued Dec. 23, 1997; and Ser. No. 08/366,790, filed Dec. 30, 1994, entitled "Differential Amplifier with Proxy Load for Control of Output Common Mode Range", now U.S. Pat. No. 5,770,968, issued Jun. 23, 1998.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

For another example, it is not strictly necessary (although it is desirable) to reduce the bias current on the MR head entirely to zero during the power-down periods.

For another example, the disclosed inventions can also be adapted to interfacing to magnetoresistive tape drive preamplifiers.

Note that the ability to rapidly enter read mode after a power-down condition is useful in many ways. For example, this circuit also permits the use of other power-saving tricks to idle the read amplifier momentarily. This can be translated into more aggressive transient-sleep strategies for power conservation, and therefore into the use of more power-hungry read amplifier designs (e.g. for higher data rate and/or lower noise) in low-power applications.

What is claimed is:

1. An integrated circuit for interfacing to a disk drive having at least one magnetoresistive sensing element, comprising:
    a current generator connected to drive a bias current across said magnetoresistive sensing element;
    connections for transferring the AC voltage on said magnetoresistive sensing element through one or more coupling capacitors, to provide a differential AC voltage signal;
    a preamplifier connected to receive and amplify said differential AC voltage signal;
    a shorting switch connected to selectably short out said differential voltage signal at the inputs to said preamplifier; and
    logic connected to activate said shorting switch for a limited time when said current generator turns on, said logic consisting of a one-shot connected to be activated by transitions, on a read/write mode-select line, from a state which indicates write mode to a state which indicates read mode;
    whereby said shorting switch discharges the DC potential which appears on said differential AC voltage signal when said current generator is first turned on.

2. The integrated circuit of claim 1, wherein said shorting switch consists of a single field-effect transistor.

3. The integrated circuit of claim 1, wherein said preamplifier has an input impedance of more than 3000 ohms.

4. The integrated circuit of claim 1, wherein said preamplifier has an input impedance of more than 10000 ohms.

5. The integrated circuit of claim 1, comprising one of said coupling capacitors interposed at each connection of said differential input signal.

6. An integrated circuit read amplifier, connectable to a magnetoresistive sensing element, comprising:
    first and second connections for receiving the voltage from a magnetoresistive element which is biased, during read conditions, but not during at least some write conditions, by a bias current;
    a preamplifier stage having first and second differential input connections operatively connected to said respective first and second connections of said magnetoresistive sensing element;
    at least one capacitor electrically interposed between one of said inputs of said amplifier stage and a respective terminal of said magnetoresistive sensing element; and
    a shorting switch which is connected across said input connections of said preamplifier stage, and is connected to logic responsive to initiation of read conditions to short out, for a period, said input connections when full bias current is restored to said magnetoresistive sensing element after having been reduced thereon; whereby saturation of said input stage due to charge pumping through said capacitors when bias current is restor is avoided.

7. The integrated circuit of claim 6, wherein said shorting switch consists of a single field-effect transistor.

8. The integrated circuit of claim 6, wherein said preamplifier has an input impedance of more than 3000 ohms.

9. The integrated circuit of claim 6, wherein said preamplifier has an input impedance of more than 10000 ohms.

10. The integrated circuit of claim 6, wherein said logic consists of a one-shot connected to be activated by transitions, on a read/write mode-select line, from a state which indicates write mode to a state which indicates read mode.

11. The integrated circuit of claim 6, comprising one of said coupling capacitors interposed at each connection of said differential input signal.

12. An integrated circuit for interfacing to a disk drive having a least one magnetoresistive sensing element, comprising:
    a switchable current generator connected to selectably drive a bias current across said magnetoresistive sensing element;
    connections for transferring the AC voltage on said magnetoresistive sensing element through one or more coupling capacitors, to provide a differential AC voltage signal;
    a preamplifier connected to receive and amplify said differential AC voltage signal;
    a shorting switch connected to selectably short out said differential voltage signal at the inputs to said preamplifier; and
    logic connected to activate said shorting switch for a limited time when said switchable current generator is switched on, said logic consisting of a one-shot connected to be activated by transitions, on a read/write mode-select line, from a state which indicates write mode to a state which indicates read mode;
    whereby said shorting switch discharges the DC potential which appears on said differential AC voltage signal when said current generator is first turned on.

13. The integrated circuit of claim 12, wherein said shorting switch consists of a single field-effect transistor.

14. The integrated circuit of claim 12, wherein said preamplifier has an input impedance of more than 3000 ohms.

15. The integrated circuit of claim 12, wherein said preamplifier has an input impedance of more than 10000 ohms.

16. The integrated circuit of claim 12, comprising one of said coupling capacitors interposed at each connection of said differential input signal.

17. A method for sensing voltages from a magnetoresistive sensing element, comprising the steps of:

(a) providing a bias current to said magnetoresistive sensing element during read modes, but not during at least some write mode;

(b) coupling the AC component of voltage on said magnetoresistive sensing element out, through one or more coupling capacitors, to differential input connections of a differential preamplifier stage; and (c) shorting together said inputs of said preamplifier stage, for a limited time, each time a current generator switches on and initiates the providing of bias current upon a transition from write mode to read mode.

18. The method of claim 17, wherein:

the shorting discharges DC potential caused by the bias current to appear at said inputs;

the limited time of the shorting together of said inputs is a time shorter than decay time of bias current saturation of the preamplifier stage that a write mode to read mode transition incurs if the step of shorting was not performed; and commencing of read mode operations occurs at the end of the limited time of shorting rather than before the decay time of the preamplifier saturation that would otherwise be incurred.

19. An integrated circuit for interfacing to a disk drive, comprising:

first external connections for one or more write heads;

second external connections for one or more magnetoresistive read heads;

read interface circuitry for providing a bias current to said second external connections, and for amplifying AC voltages received on said second external connections;

write amplifier circuitry for driving said write heads in accordance with signals received on said first external connections;

wherein said read interface circuitry comprises a current generator connected to drive a bias current across said magnetoresistive sensing element;

connections for transferring the AC voltage on said magnetoresistive sensing element through one or more coupling capacitors, to provide a differential AC voltage signal;

a preamplifier connected to receive and amplify said differential AC voltage signal;

a shorting switch connected to selectably short out said differential voltage signal at the inputs to said preamplifier; and logic connected to activate said shorting switch for a limited time when said current generator turns on, said logic consisting of a one-shot connected to be activated by transitions, on a read/write mode-select line, from a state which indicates write mode to a state which indicates read mode;

whereby said shorting switch discharges the DC potential which appears on said differential AC voltage signal when said current generator is first turned on.

20. The integrated circuit of claim 19, wherein said shorting switch consists of a single field-effect transistor.

21. The integrated circuit of claim 19, wherein said preamplifier has an input impedance of more than 3000 ohms.

22. The integrated circuit of claim 19, wherein said preamplifier has an input impedance of more than 10000 ohms.

23. The integrated circuit of claim 19, comprising one of said coupling capacitors interposed at each connection of said differential input signal.

24. An AC input stage comprising:

a tansducer for reading data from a medium during read mode periods;

means for applying a DC bias to the transducer during read mode periods onto which an AC signal voltage is imposed that varies in accordance with data on said medium which the transducer reads, the DC bias causing a DC voltage drop across the transducer that is substantially greater than the AC signal voltage;

the means for applying a DC bias also characterized by initiating the application of DC bias at the beginning of read mode periods;

an amplifier stage for amplifying the AC signal voltage having a pair of input terminals connected by capacitively coupling to the transducer;

characteristics of the DC bias, the amplifier stage and the capacitive coupling, in combination, being such that the amplifier stage is subject to saturation upon initiation of the DC bias for a saturation time during which read mode operations are impaired;

means for shorting together the inputs of the amplifier stage upon the initiation of the DC bias, to discharge DC voltage from the inputs, for a pulse time that is shorter than the saturation time the amplifier stage is subject to based on said characteristics without shorting, whereby read mode operations are enabled promptly after the pulse time.

25. The AC input stage of claim 24, wherein:

the capacitive coupling and the amplifier stage are contained within an integrated circuit, the capacitance of the capacitive coupling is of a low value of about 100 pF for each capacitor of the capacitive coupling to enable ease of integration, and the amplifier stage has a high input impedance of about 10,000 ohms or more so a product of the capacitance and the input resistance results in short time constant and high speed operation of the amplifier stage.

* * * * *